United States Patent
Makiyama et al.

(10) Patent No.: US 7,718,541 B2
(45) Date of Patent: May 18, 2010

(54) METHOD OF PROCESSING RESIST, SEMICONDUCTOR DEVICE, AND METHOD OF PRODUCING THE SAME

(75) Inventors: Kozo Makiyama, Kawasaki (JP); Ken Sawada, Ebina (JP)

(73) Assignee: Fujitsu Limited, Kawasaki (JP)

( * ) Notice: Subject to any disclaimer, the term of this patent is extended or adjusted under 35 U.S.C. 154(b) by 904 days.

(21) Appl. No.: 11/185,807

(22) Filed: Jul. 21, 2005

(65) Prior Publication Data

US 2005/0255696 A1 Nov. 17, 2005

Related U.S. Application Data

(63) Continuation of application No. PCT/JP03/05828, filed on May 9, 2003.

(51) Int. Cl.
*H01L 21/027* (2006.01)
*H01L 21/469* (2006.01)

(52) U.S. Cl. ................ 438/725; 438/708; 438/788

(58) Field of Classification Search ............... None
See application file for complete search history.

(56) References Cited

U.S. PATENT DOCUMENTS

| | | | | |
|---|---|---|---|---|
| 6,025,259 | A * | 2/2000 | Yu et al. | 438/618 |
| 6,107,204 | A * | 8/2000 | Yu et al. | 438/694 |
| 6,270,929 | B1 * | 8/2001 | Lyons et al. | 430/5 |
| 6,566,040 | B1 | 5/2003 | Sugino et al. | 430/313 |
| 7,008,832 | B1 * | 3/2006 | Subramanian et al. | 438/182 |
| 2002/0064958 | A1 | 5/2002 | Takeuchi | |
| 2003/0025208 | A1 | 2/2003 | Makiyama et al. | |
| 2005/0147928 | A1 * | 7/2005 | Frost et al. | 430/330 |

FOREIGN PATENT DOCUMENTS

JP 10-73927 3/1998

(Continued)

OTHER PUBLICATIONS

Japanese Office Action dated Dec. 2, 2008 (in Japanese, with Summary in English).

*Primary Examiner*—Zandra Smith
*Assistant Examiner*—Pamela E Perkins
(74) *Attorney, Agent, or Firm*—Kratz, Quintos & Hanson, LLP

(57) ABSTRACT

A surface component film (2) is etched using a resist (3) as a mask, and the surface component film (2) is patterned according to the shape of an aperture (3a). This results in a step portion (4) having the same shape as the aperture (3a), with the sidewall (4a) of the step portion (4) exposed through the aperture (3a). The aperture (3a) is spin-coated with a shrink agent, reacted at a first temperature, and developed to shrink the aperture (3a). To control the shrinkage with high accuracy, in the first round of reaction, the aperture is shrunk by, for example, about half of the desired shrinkage. The aperture (3a) is further spin-coated with a shrink agent, reacted at a second temperature, and developed to shrink the aperture (3a). In this embodiment, the second-round shrink process will result in the desired aperture length. The second temperature is adjusted based on the shrinkage in the first round. With respect to a resist using short-wavelength light (short-wavelength resist) or a resist using electron beam (electron beam resist), a minute aperture can be obtained with stable shrink effect and accurate control of the length thereof.

20 Claims, 10 Drawing Sheets

FOREIGN PATENT DOCUMENTS

| | | |
|---|---|---|
| JP | 2000-058506 | 2/2000 |
| JP | 2000-124227 | 4/2000 |
| JP | 2000-298356 | 10/2000 |
| JP | 2001-5197 | 1/2001 |
| JP | 2002-134379 | 5/2002 |
| JP | 2003-7729 | 1/2003 |
| JP | 2003-60028 | 2/2003 |
| JP | 2003-115500 | 4/2003 |

* cited by examiner

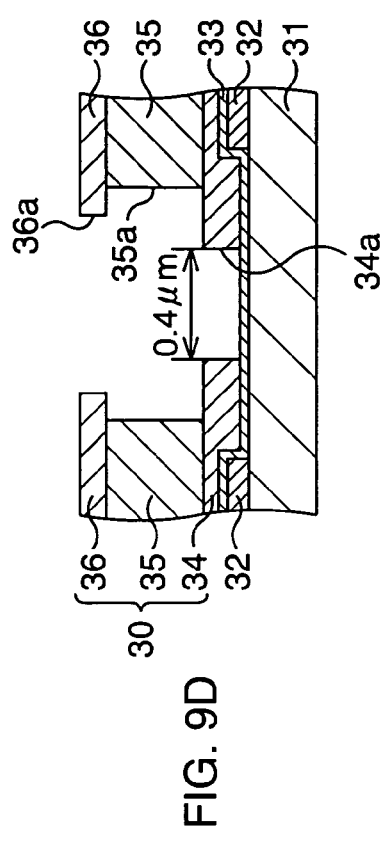
FIG. 9D
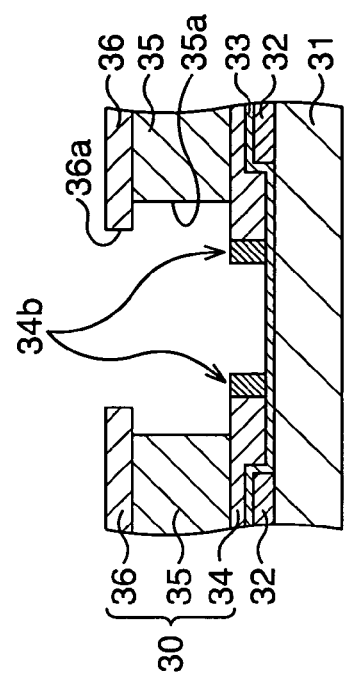
FIG. 9E
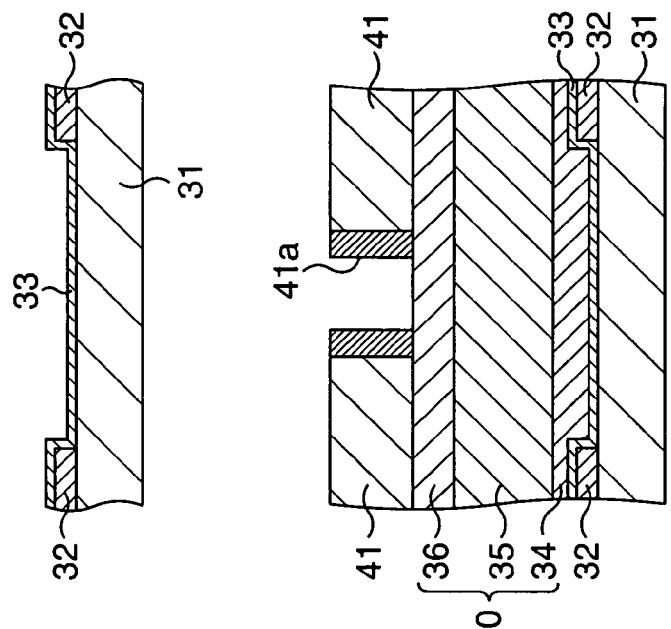
FIG. 9A
FIG. 9B
FIG. 9C
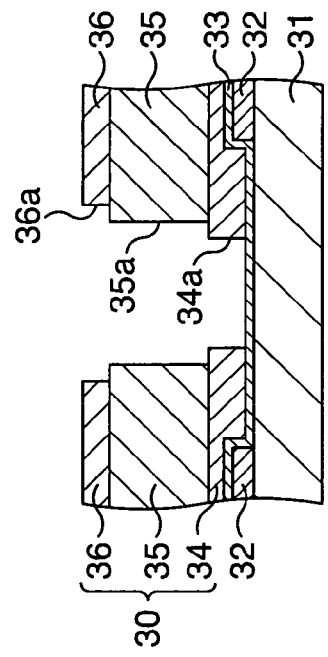

METHOD OF PROCESSING RESIST, SEMICONDUCTOR DEVICE, AND METHOD OF PRODUCING THE SAME

This application is a continuation of international application PCT/JP03/05828 filed May 9, 2003.

TECHNICAL FIELD

The present invention relates to a method of processing a resist, a semiconductor device and a method of producing the same, and is directed to a technology to shrink a resist aperture stably and dramatically to achieve fine patterns.

BACKGROUND ART

In recent years, minimization technology has been used extensively for wiring and so forth to meet the need for reduction in the circuit area and increase in the performance of semiconductor memories and system LSI devices, and latest lithographic techniques will be presently used, in particular, for the microfabrication of contact holes connecting wiring layers. On the other hand, transistors with superior high-frequency characteristics require minute gate electrodes, and transistors having minute gate electrodes, and especially compound semiconductors, are useful for signal processing (optical communication) as well as for the transmission and reception of submillimeter and millimeter waves. For devices requiring superior high-frequency characteristics, in particular, the gate length has been decreased intensively by electron beam lithography.

Minute apertures have been formed conventionally by decreasing the wavelength of exposure light source or reducing the size of electron beams. Alternatively, the aperture length has been decreased by heat-treating a resist or different types of resists have been mixed.

However, decreasing the wavelength of the light source to form minute resist apertures is costly, because the equipment and masks are expensive.

For the use of the electron beam exposure technology to form minute apertures, apertures with an aperture length of 0.05 μm or less have been obtained by improving the accuracy of beam forming, though throughput and stability problems remain. Therefore there is a need for a technique to form a minute aperture by electron beam lithography equipment using an inexpensive light source or having a stable technical level, but the amount of reduction in the aperture length has been limited to 0.05 μm with conventional resist deformation (heat treatment, mixing) technology.

It is an object of the present invention to provide, with respect to a resist using short-wavelength light (short-wavelength resist) or a resist using electron beam (electron beam resist), a method of forming a resist allowing for stable shrink effect, the manufacture of a minute aperture and the accurate control of the length thereof, and to provide a semiconductor device and a method of manufacturing the same by applying the above forming method. Concretely, the short wavelength resist is aimed at an accurate aperture reduction of more than 0.1 μm, and the electron beam resist is aimed at an aperture length of 0.05 μm or less.

SUMMARY OF THE INVENTION

The method of processing a resist of the present invention includes the steps of forming a resist above a substrate, forming an aperture in the resist, processing an exposed portion from the aperture using the resist as a mask to form a relative step portion according to the shape of the aperture based on the surface of the substrate, and processing the resist a plurality of times to shrink the aperture.

The method of manufacturing the semiconductor device of the present invention includes the steps of forming an interlayer insulator film above a substrate, forming a resist on the interlayer insulator film, forming an aperture in the resist, processing the interlayer insulator film using the resist as a mask to form a groove in the interlayer insulator film according to the shape of the aperture based on the surface of the substrate, processing the resist a plurality of times to shrink the aperture, processing the interlayer insulator film using the resist after shrinkage as a mask to form a connecting hole in the interlayer insulator film according to the shape of the aperture after shrinkage, removing the resist, and depositing conductive material on the interlayer insulator film so as to fill the groove and the connecting hole.

In another aspect, the method of manufacturing the semiconductor device of the present invention includes the steps of forming a resist above a substrate, forming an aperture in the resist, processing an exposed portion from the aperture using the resist as a mask to form a relative step portion according to the shape of the aperture based on the surface of the substrate, processing the resist a plurality of times to shrink the aperture, depositing conductive material so as to fill the aperture, and removing the resist to form a gate electrode comprising the conductive material.

The semiconductor device of the present invention includes a semiconductor substrate, a gate electrode formed on the semiconductor substrate and a surface component film formed on the semiconductor substrate so as to be exposed along the side of the junction of the gate electrode and the semiconductor substrate.

In another aspect, the semiconductor device of the present invention includes a semiconductor substrate, a gate electrode formed on the semiconductor substrate, an interlayer insulator film that is formed on the semiconductor substrate so as to cover the gate electrode and that contains a groove formed on the surface layer and a connecting hole formed in an integrated manner with the groove, and wiring extending on the interlayer insulator film, and filling the groove and the connecting hole.

BRIEF DESCRIPTION OF THE DRAWINGS

FIGS. 9A to 9E are schematic sectional views showing the method of manufacturing a transistor in order of steps according to embodiment 3.

DETAILED DESCRIPTION OF THE PREFERRED EMBODIMENTS

Outline of the Present Invention

Figure 1A:
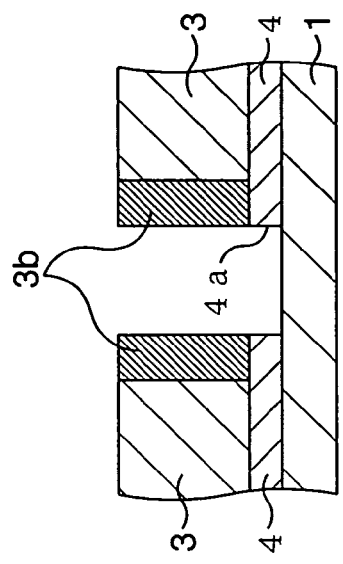
FIGS. 1A to 1D are simplified schematic sectional views showing the basic principle.

When an ordinary shrink agent is used, an aperture shrinkage of 0.05 μm or less is achieved by applying an aperture shrink agent after forming an aperture. It is necessary to increase the reaction temperature or the concentration of the agent to increase the shrinkage; however, clogging may occur if the aperture length is 0.1 μm or less or a shrinkage per round is 0.05 μm or more. Clogging of the aperture may occur even when the intended shrinkage is attained through multiple rounds of reaction. This clogging has significant effect on apertures for gate fingers, in particular, which have an aperture width of several tens μm or more, representing a major cause of a marked reduction in the device yield.

The inventor has found that to maintain a stable, considerable aperture shrink effect, it is necessary to provide a relative step portion directly below a resist aperture based on the surface of the substrate, and expose, at the bottom of the aperture, the end face of the component (insulator or substrate of any material) below the resist while performing the shrink operation. Required aperture shrink effect may vary depending on the structure of the resist treated, such as a single-layer or multilayer structure. For example, in the case of a multilayer resist, shrinking must have a great effect on a particular layer in a selective manner. In addition, establishment of a technique to achieve a stable remarkable shrink is a necessity, which has been difficult with conventional art. According to the present invention, it will be possible to achieve a remarkable shrink exceeding, for example 0.2 μm, by providing a relative step portion directly below a resist aperture.

Furthermore, according to the present invention, the shrink process for a resist aperture may be divided into multiple rounds. This provides for accurate control of shrinkage and aperture condition. Considering that the shrunk aperture is subjected to a subsequent process, for example, dry etching, the use of the multiple-round processing is expected to allow the outermost surface of at least the shrunk region of a resist to have sufficient durability. In these cases, by allowing the aperture to shrink while, for example, varying the reaction temperature of the shrink agent, a desired aperture length can be achieved stably, and by performing the final round of shrink reaction at high temperature, a denser surface can be achieved. Alternatively, the aperture may be preferably shrunk multiple times while varying the chemical composition to form denser outermost surfaces on the shrunk region.

According to the present invention, to control shrinkage individually in a substrate (circuit), a phenomenon that shrinkage differs depending on the molecular state or the surface condition even in the same resist resin is utilized to establish a method of shrinking a particular region in the substrate or circuit. The particular region refers to a particular side wall in a particular or the same resist aperture. An effective method of modifying the resist molecular or surface condition of a particular region in a selective manner involves modifying a particular region of resist resin by electron beam or light irradiation. This particular region is referred to as a modified region.

The basic principle of the present invention is described more concretely below. FIGS. 1A to 1D are simplified schematic sectional views showing the basic principle.

A relative step portion is first formed on a substrate based on its surface.

As shown in FIG. 1A, a surface component film 2 is formed, for example, on a semiconductor substrate 1. The surface component film 2 may be of any material. Next, a resist 3 is applied onto the surface component film 2, and, for example, an aperture 3a is formed by, for example, photolithography.

Figure 1B:
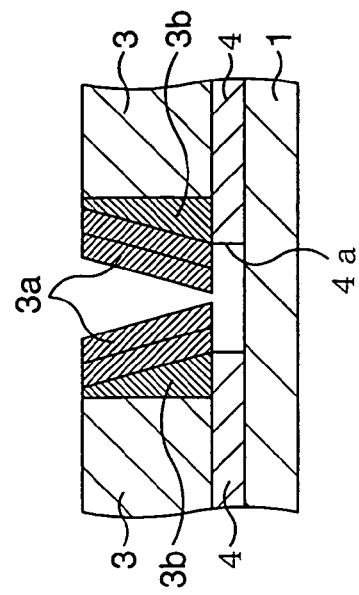

As shown in FIG. 1B, the surface component film 2 is etched using the resist 3 as a mask, and the surface component film 2 is patterned according to the shape of the aperture 3a. This results in a step portion 4 having the same shape as the aperture 3a, and a sidewall 4a of the step portion 4 is exposed from the aperture 3a. The formation of the resist aperture and the formation of the surface component film aperture may be in any order as long as the sidewall 4a is exposed.

Figure 1C:
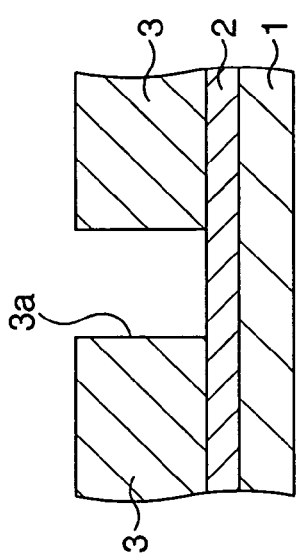

As shown in FIG. 1C, the aperture 3a area of the resist 3 is then irradiated with light or electron beam, as required, to modify the resist molecular or surface condition in the aperture area in a selective manner to form a modified region 3b. The formation of the modified region 3b is not necessarily required for the present invention.

Figure 1D:
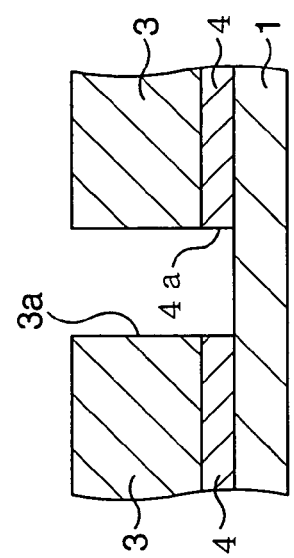

As shown in FIG. 1D, the wall of the aperture 3a is then tapered by heat treatment, spin-coated with a shrink agent, reacted at a first temperature, and developed to shrink the aperture 3a. To control the shrinkage with high accuracy, in the first round of reaction, the aperture is shrunk by, for example, about half of the desired shrinkage. The aperture 3a is further spin-coated with a shrink agent, reacted at a second temperature, and developed to shrink the aperture 3a. In this embodiment, the second-round shrink process results in the desired aperture length. In this embodiment, at least one round of the shrink process is carried out at a temperature different from that for the other round of the shrink process. Here, the second temperature is adjusted based on the shrinkage in the first round. The treatment temperature can be increased on a stepwise basis to reduce the aperture length in the multiple-round shrink process. However, it is necessary to set the treatment temperature at a lower level when, for example, adjusting the shrinkage in the final process. Thus this technique to achieve a desired shrinkage through the multiple-round shrink process is effective for achieving a targeted aperture length with accuracy.

Figure 2:
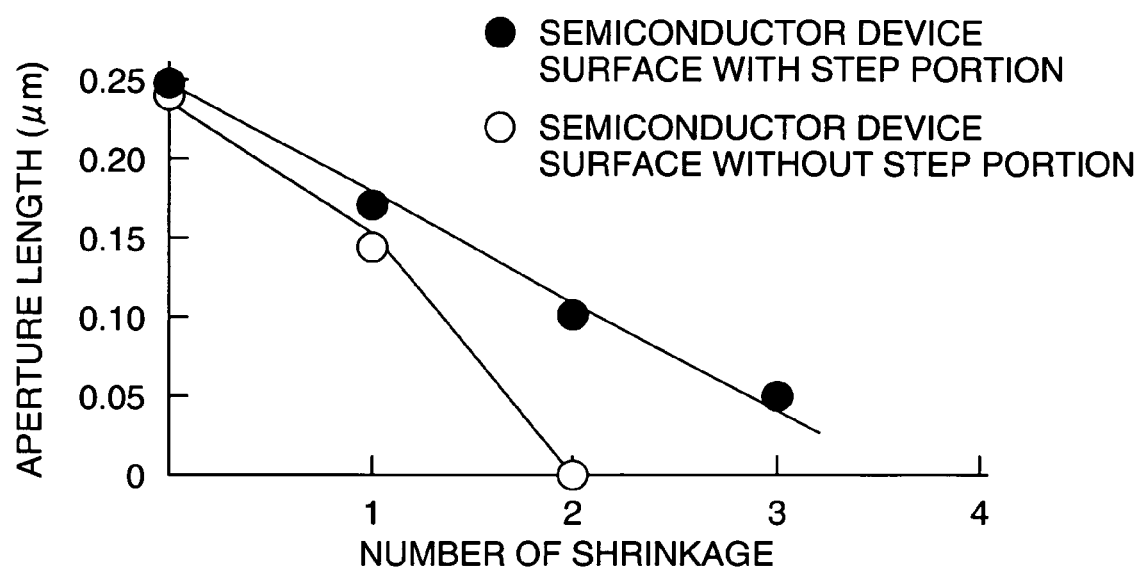
FIG. 2 is a characteristic view showing the results of an experiment that examined the resist aperture length when the resist was subjected to multiple rounds of shrink process.

Here, the effect of the aforementioned step, which is the main component of the present invention, was examined. The experiment examined the resist aperture length when the resist aperture was subjected to multiple rounds of shrink process in the presence or absence of such step. The experimental results are shown in FIG. 2. Thus even if the shrink process is divided into multiple rounds, the aperture will clog in the second round of shrink due to the loss of controllability unless the aforementioned step is provided. In contrast, it has been found that by providing such step, nearly the same amount of shrinkage is achieved in each round of shrink process, and an aperture of an aperture length of 0.05 μm is obtained in the third round with good controllability.

If the aperture is exposed to a dry etching gas after being shrunk, desirably at least one round of the shrink process is carried out using a shrink agent at a concentration different from that for the other rounds. Concretely a shrink agent containing cross-linking components in large quantities may be used in the second or final round of the shrink process to form a comparatively durable surface layer in the surface shrink area. A comparatively durable surface layer can also be formed by increasing the reaction temperature in the final round of shrink. On the other hand, when selective shrinking is desired, for example when selective shrinking of apertures for fast-operating gate fingers, in particular, in the circuit or apertures for contact holes in the circuit element-dense region is desired, the portion requiring a large shrinkage is irradiated with electron beam or light. In the case of an electron beam resist, a selective large shrink is produced at a site where the density of molecular structure has been impaired by electronic irradiation. In the case of a UV photo resist, the hydrophilic property of the resist surface is increased by irradiation with light, and the affinity of the shrink agent increases, resulting in a selective large shrinkage.

Minute gate electrodes can be formed with high accuracy using the resist with the aperture 3a thus obtained to process, for example, a metal film, resulting in high-performance transistors.

—Specific Embodiments of the Invention—

(Examples of Shrink Agents)

Examples of shrink agents as used according to embodiments of the invention are first described.

Conventionally, deep UV light can be used as exposure light for photoresist to produce reasonably minute patterns provided that KrF (krypton fluoride) excimer laser light (wavelength 248 nm) is used. A technology called RELACS is known which uses this KrF (krypton fluoride) excimer laser light and allows for more minute resist patterns than is normally expected from its capacity, using an easy technique.

According to Japanese Patent Application Laid-Open No. 10-73927, a photoresist sensitive to KrF (krypton fluoride) excimer laser light is exposed first to obtain a resist pattern. Subsequently a coating is provided so as to cover the resist pattern, and the resist material is swollen by allowing this coating and the resist material to interact in the interface, thus allowing, for example, a hole pattern to produce more minute holes than the exposure limit defines. The aforementioned prior art discloses that resist materials can be either the positive or negative type and may include novolac resin and naphthoquinonediazide photosensitive agents, and the chemical amplification type of resist having acid generation mechanisms can also be applied. The disclosure also states regarding resin compositions used for coating that polyacrylic acid, polyvinylacetal, polyvinylpyrrolidone, polyvinyl alcohol, polyethyleneimine, polyethylene oxide, styrene-maleic acid copolymer, polyvinylamine resin, polyallylamine, oxazoline-containing water-soluble resin, water-soluble melamine resin, water-soluble urea resin, alkyd resin and sulfonamide resin can be effectively applied. It is also disclosed that any will be all right if crosslinking is produced in the presence of an acid component, or if mixing with a water-soluble crosslinking agent is possible although crosslinking is not produced, and that these may be used independently or as a mixture. It is also disclosed that crosslinking agents for coating can include urea crosslinking agents, such as urea, alkoxymethylene urea, N-alkoxymethylene urea, ethylene urea and ethylene urea carboxylic acid, methylene, melamine crosslinking agents, such as alkoxymethylene melamine, and amino crosslinking agents such as benzoguanamine and glycoluryl, and any will be applied as long as it is a water-soluble crosslinking agent forming crosslinking with an acid.

Although the foregoing method can be easily used by manufacturers, the resist pattern swelling effect of any combination of the aforementioned materials can only be expected if KrF (krypton fluoride) excimer laser light is used, and the use of light of shorter wavelengths with the disclosed prior art will result in no effect.

For ArF (argon fluoride) excimer laser light (wavelength 193 nm), which has been already put into practical use as a next-generation technology for KrF (krypton fluoride) excimer laser light (wavelength 248 nm), aromatic resin compositions such as novolac resin cannot be adopted as a resist material. The reason is that because the aromatic ring in itself strongly absorbs UV light in the wavelength range shorter than ArF (argon fluoride) excimer laser light, the resist film does not transmit exposure light. Consequently, for ArF (argon fluoride) excimer laser light, a new composition not containing the aromatic ring must be adopted as a resist composition, and thus the pattern swelling would not occur even if coating is formed on such a new resist composition using the compositions described in the aforementioned prior art.

Thus, conventional technologies do not provide for the pattern swelling effect of light in the wavelength range shorter than ArF (argon fluoride) excimer laser light (wavelength 193 nm). Therefore in an embodiment of the present invention, a shrink agent is used that allows the method of forming a coat on a resist film after pattern formation to achieve pattern swelling, a method similar to the RELACS technology, to be used with, for example, ArF (argon fluoride) excimer laser light.

The shrink agent contains a resin composition comprising at least one resin selected from the group consisting of polyvinyl alcohol, polyvinylacetal and polyvinyl acetate, a water-soluble composition comprising at least one crosslinking agent selected from the group consisting of melamine derivatives, urea derivatives and uryl derivatives, and at least one surfactant selected from the group consisting of polyoxyethylene-polyoxypropylene condensates, polyoxyalkylene alkylethers, polyoxyethylene alkyl ethers, polyoxyethylene derivatives, sorbitan fatty acid esters, fatty acid esters of glycerin, primary alcohol ethoxylates and phenol ethoxylates.

Concretely several percent surfactant is added to the resin base material mixing polyvinylacetal and polyvinyl alcohol. Specifically, the shrink agent of the invention contains a resin composition comprising polyvinylacetal and polyvinyl alcohol in a 7:3 ratio by weight, a water-soluble composition comprising at least one crosslinking agent selected from the group consisting of melamine derivatives, urea derivatives and uryl derivatives, and at least one surfactant selected from polyoxyethylene-polyoxypropylene condensates and the like. The known spin coat method may be used for the coating, and the coating thickness may be at least about 1000 Å, preferably about 200 nm to 500 nm.

The fact that the coating thickness increases, for example, 4% after the application of the pattern swelling coat/pure water development indicates the pattern swelling. If pre-exposure and post-exposure bake was performed at 130° C. and 140° C., respectively, and the exposure level was set at 50 mJ/cm$^2$, a 3.5% increase in coating thickness was observed after the resist pattern swelling coat was allowed to stand for two minutes as compared to just after development. When post-exposure bake was applied under the same conditions, a 3.4% increase in coating thickness was observed after the resist pattern swelling coat was applied, developed with pure water and allowed to stand for two minutes. The use of pure water to remove the non-swollen portion of the resist pattern (including the excessive resist pattern swelling coating) will obviate the need for post-development washing as required when water-soluble alkali developing solution is used, and simplify the overall process.

Consequently, in the embodiment of the present invention, appropriate concentrations of resin, surfactant and crosslinking agent were selected to achieve an appropriate shrinkage (increase in coating thickness) using the aforementioned shrink agent which acts on even the non-aromatic ArF resist which does not have the acid generating mechanism of KrF resists and the like.

Embodiments of the present invention are described in detail below by referring to the drawings.

Embodiment 1

In this embodiment, the present invention is applied in forming minute contact holes in an interlayer insulator film to manufacture transistors.

FIGS. 3A to 3C and FIGS. 4A to 4C are schematic sectional views showing the method of manufacturing a transistor in order of steps according to embodiment 1.

Figure 3C:
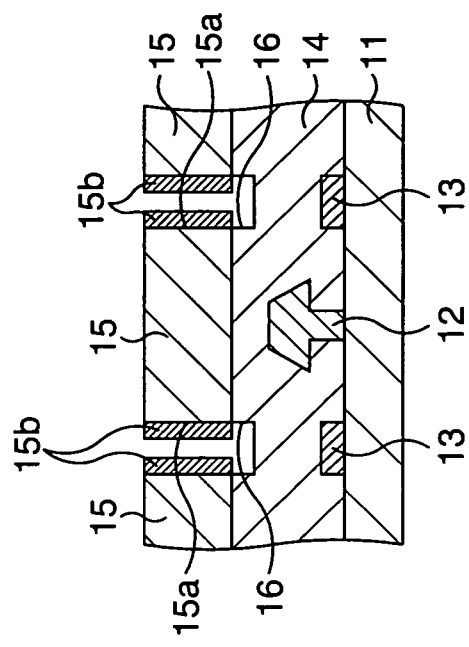
FIGS. 3A to 3C are schematic sectional views showing the method of manufacturing a transistor in order of steps according to embodiment 1.
Figure 3A:
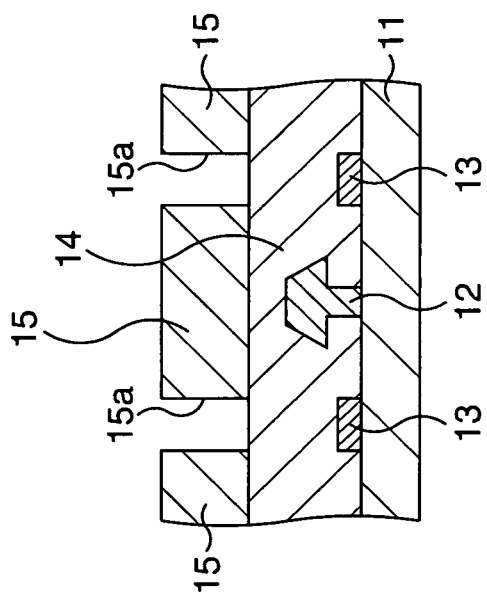

As shown in FIG. 3A, a gate electrode 12 and a source/drain 13 which is a pair of ohmic electrodes are formed on a semiconductor substrate 11.

Then polyimide resin is applied to a coating thickness of about 1.0 µm by the spin coat method so as to cover the gate electrode 12 and the source/drain 13, and heat treated to form an interlayer insulator film 14. The interlayer insulator film 14 may be a single-layer film consisting of only polyimide resin or a multilayer film consisting of two or more different materials, such as a film consisting of polyimide resin and a nitride film deposited thereon. A resist (for example, PFI-32A, Sumitomo Chemical Co., Ltd.) is applied onto the interlayer insulator film 14 to form a resist film 15, and apertures 15a of about 0.4 µm in length are formed by the UV exposure method above the source/drain 13 in this resist film 15 at sites aligned with the source/drain 13.

Figure 3B:
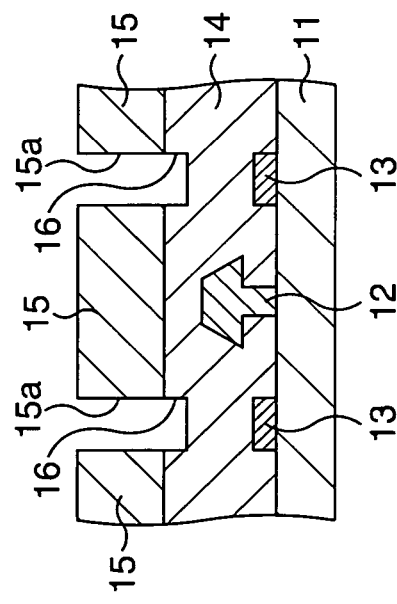

As shown in FIG. 3B, the interlayer insulator film 14 is then dry-etched using the resist film 15 as a mask, and a groove 16 about 0.05 µm in depth is formed according to the shape of the aperture 15a. The groove 16 provides a relative step portion based on the surface of the interlayer insulator film 14.

The aperture 15a is then shrunk through multiple, for example two in this embodiment, rounds of the shrink process.

Concretely, as shown in FIG. 3C, a shrink agent is applied to the resist film 15 by the spin coat method, and heat treated at 100° C. for one minute and washed for one minute to shrink the aperture 15a from about 0.4 µm to about 0.2 µm in length (first-round shrink process). The resist film is further heat treated at 95° C. for one minute and washed for one minute to shrink the aperture 15a from about 0.2 µm to about 0.1 µm in length (second-round shrink process).

Figure 4A:
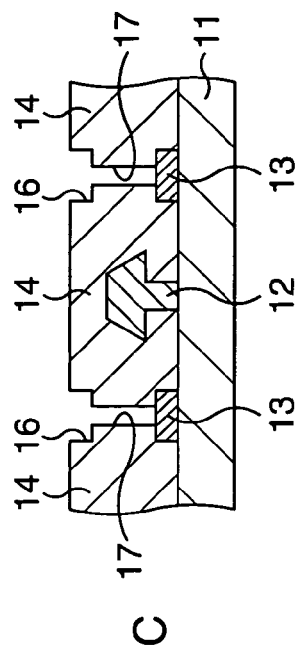
FIGS. 4A to 4D are schematic sectional views showing the method of manufacturing a transistor in order of steps according to embodiment 1.

The shrunk region 15b of the resist film 15 forms an eaves structure projecting from the groove wall due to the presence of the groove 16. When the lower part of the shrunk region 15b must be brought in contact with the groove wall to meet process requirements, as shown in FIG. 4A, for example, heat treatment may be performed after the shrink process at a temperature equal to or higher than the softening point of the shrink agent.

Figure 4B:
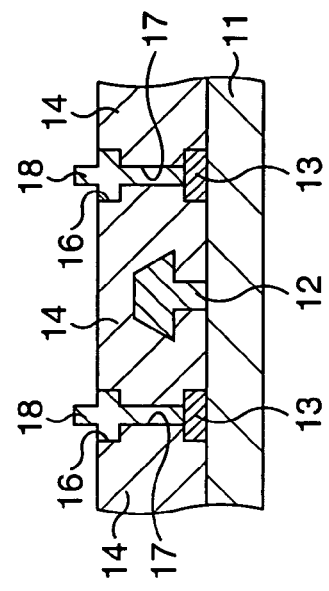

As shown in FIG. 4B, the interlayer insulator film 14 is then etched by anisotropic dry etching, using the resist film 15 having the shrunk aperture 15a as a mask, to form a contact hole 17 exposing part of the surface of the source/drain 13.

Figure 4C:
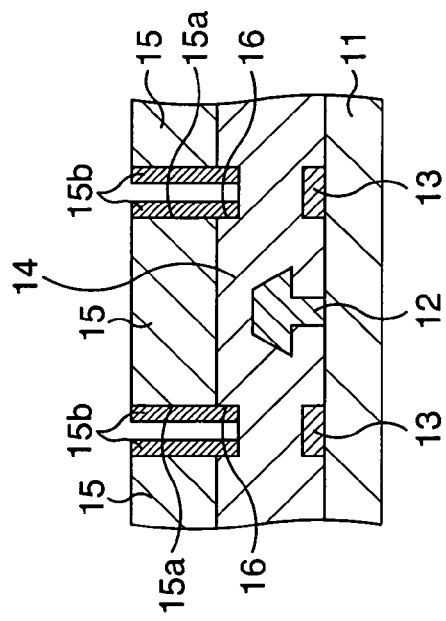

As shown in FIG. 4C, removal of the resist film 15 by ashing process and so forth leaves in the interlayer insulator film 14 the contact hole 17 formed in an integrated manner with the groove 16.

Figure 4D:
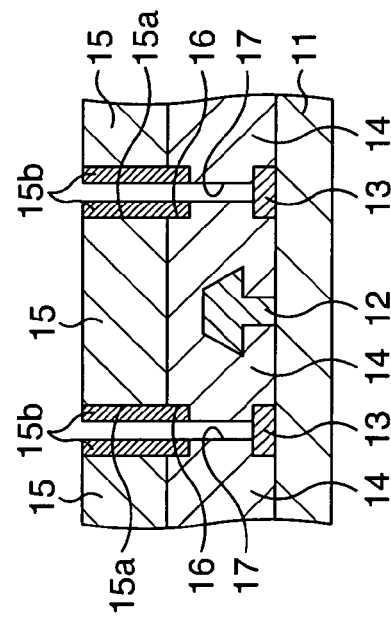

As shown in FIG. 4D, the seed for plated coating, for example, Ti/Au film (not shown) is then formed by the sputtering method and so forth to a coating thickness of about 10 nm to 20 nm so as to cover the sidewalls of the groove 16 and the contact hole 17, a resist film (not shown) is formed by application, and an aperture of an electrode shape is formed in the resist film by photolithography. Au is then deposited so as to fill at least the contact hole 17 with, for example, Au electrolytic plating, the resist film is removed, and excessive seed is removed. Consequently, wiring 18 is formed, which fills at least the contact hole 17, is connected electrically to the source/drain 13 and extending on the interlayer insulator film 14. Here, the wiring 18 is formed such that the width of the portion projecting from the interlayer insulator film 14 is narrower than the width of the groove 16. Although the wiring process of the gate electrode is not illustrated in this embodiment, wiring can be formed which is connected electrically to the gate electrode 12 through a contact hole formed in the interlayer insulator film 14 as with the wiring 18.

Additional interlayer insulator film, upper-layer wiring and a protective film are formed to complete an integrated circuit.

As described above, according to the embodiment, a resist aperture can be formed with stable shrink effect and accurate control of the aperture length, and a minute contact hole 17 can be achieved using this. This provides a contact hole with an aperture length on the order of 0.1 µm, which has been achieved only with the exposure technology using ArF and so forth, by the inexpensive UV-exposure method, and minute wiring connected through these contact holes can be achieved.

Embodiment 2

In this embodiment, the present invention is applied in forming what is generally called mushroom type gate electrodes using electron beam lithography to manufacture transistors.

FIGS. 5A to 5D and FIGS. 6A to 6D are schematic sectional views showing the method of manufacturing a transistor in order of steps according to embodiment 2.

Figure 5A:
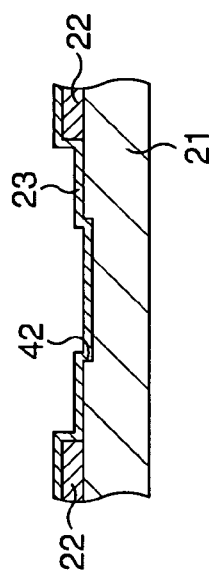
FIGS. 5A to 5D are schematic sectional views showing the method of manufacturing a transistor in order of steps according to embodiment 2.

As shown in FIG. 5A, a buffer layer, an InGaAs channel layer, an AlGaAs electron-supplying layer and a GaAs low-resistance layer are first grown sequentially on a semi-insulating GaAs substrate by the MOCVD method to form a compound semiconductor substrate 21, and an active region is formed by oxygen impregnation to form, for example, the source/drain 22, which is a pair of ohmic electrodes consisting of AuGe/Au with a coating thickness of about 20 nm/200 nm.

The low-resistance layers about 0.1 µm wide at both ends of the gate finger in the active region are removed by etching to form a groove 42, and a surface component film 23 consisting of, for example, silicon nitride is formed on the compound semiconductor substrate 21 so as to cover the source/drain 22.

Figure 5C:
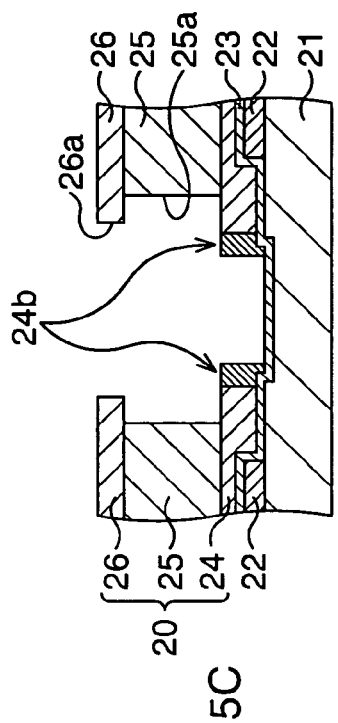
Figure 5B:
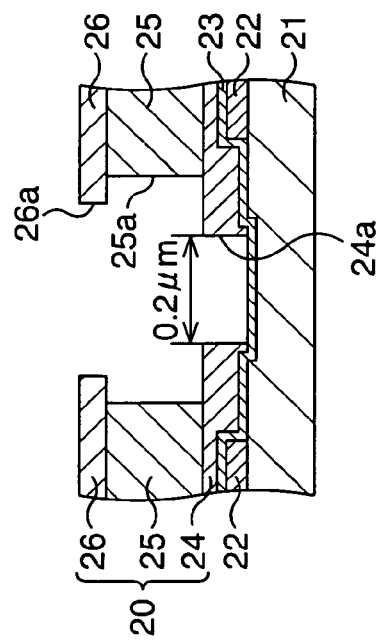

As shown in FIG. 5B, a multilayer resist film 20 is then formed by application.

Concretely, the positive type electron beam resist polymethyl methacrylate (PMMA) is first applied to a coating thickness of around 300 nm by the spin coat method and heat treated at 180° C. for five minutes to form a lower layer resist film 24. The alkali soluble resin polymethyl glutarimide (PMGI) is then applied to a coating thickness of around 500 nm by the spin coat method and heat treated at 180° C. for three minutes to form an intermediate layer resist film 25. A positive type electron beam resist (for example, ZEP520, Xeon Corp.) is then applied by the spin coat method and heat treated at 180° C. for three minutes to form an upper layer resist film 26. Consequently, a multilayer resist film 20 laminated with the lower resist film 24, intermediate resist film 25 and the upper layer resist film 26 starting from the front face of the compound semiconductor 21 is formed.

Then an eaves-shaped resist aperture which permits lift-off is formed on the surface of the compound semiconductor substrate 21 to form a mushroom type gate electrode.

Concretely, for example a pattern 0.7 μm in length and a pattern 0.1 μm in length are drawn in succession in the direction of electric current by electron beam lithography. The upper layer resist film 26 is then developed by a liquid mixture such as MIBK/IPA to form an over gate aperture 26a to be used for forming an over gate portion in the upper layer resist film 26 with a large electrode length, and the intermediate resist film 25 is side etched with an alkali developer such as TMAH using the upper layer resist film 26 as a mask to form an aperture 25a in the intermediate resist film 25. Then, a fine gate aperture 24a, an aperture to form a fine gate portion conducting channel control of field-effect transistors, with a length of 0.2 μm in the direction of electric current is formed in the lower layer resist film 24 with a liquid mixture such as MIBK/IPA containing a lower concentration of MIBK than the developer used for the upper layer resist film 26.

Generally two independent rounds of drawing are necessary to form the eaves structure of this embodiment in a resist, and there is concern that this may reduce throughput. Therefore, in this embodiment, an appropriate resist structure is selected, over gate drawing and fine gate drawing are performed simultaneously, and then development is performed sequentially starting from the upper layer resist film 26 to form an aperture. However, the aperture length that can be achieved on a routine basis is about 0.2 μm, because the fine gate aperture expands due to the effect of electron beam scattering.

Then as shown in FIG. 5C, to increase the shrink effect on the fine gate aperture 24a, the fine gate aperture 24a area in the lower layer resist film 24 is irradiated with electron beam and exposed to a dose smaller than the development $E_{th}$, to form a modified region 24b. This will result in a greater shrink reaction occurring only in the fine gate aperture 24a. In addition, the resist configuration of the present invention does not originally cause shrink reaction in other resist films. Because aperture shrinking is normally targeted at only the fine gate aperture, a resin having low affinity with the shrink agent is used for the over gate portion (including the eaves portion) and a resin having high affinity with the shrink agent is used for the fine gate portion.

Figure 5D:
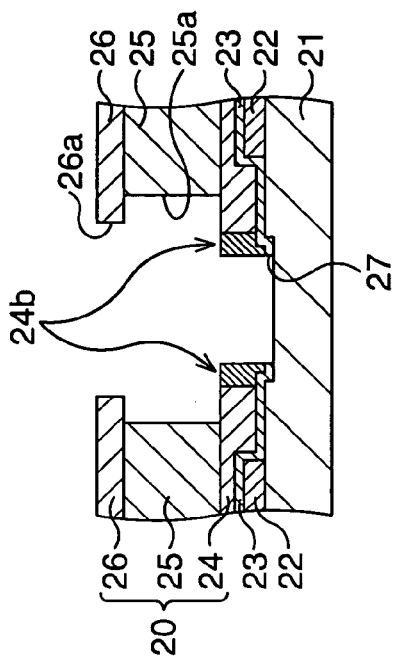

As shown in FIG. 5D, the surface component film 23 is then dry etched using the lower resist film 24 as a mask, and $SF_6$ as etching gas to form in the surface component film 23 a step portion of the same shape as the fine gate aperture 24a, with the side wall 27 of the step portion exposed from the aperture 24a.

Figure 6A:
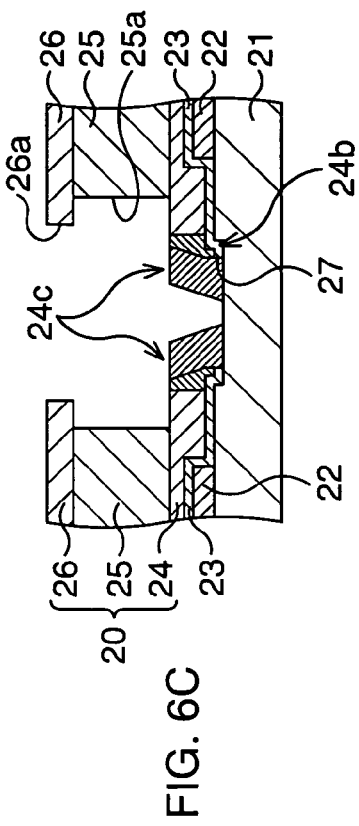
FIGS. 6A to 6D are schematic sectional views showing the method of manufacturing a transistor in order of steps according to embodiment 2.

Then as shown in FIG. 6A, the sidewall of the fine gate aperture 24a is processed by heat treatment at 130° C. for 10 minutes such that it will be tapered at an angle of about 70 degrees to a horizontal plane (for example, the substrate surface).

Figure 6B:
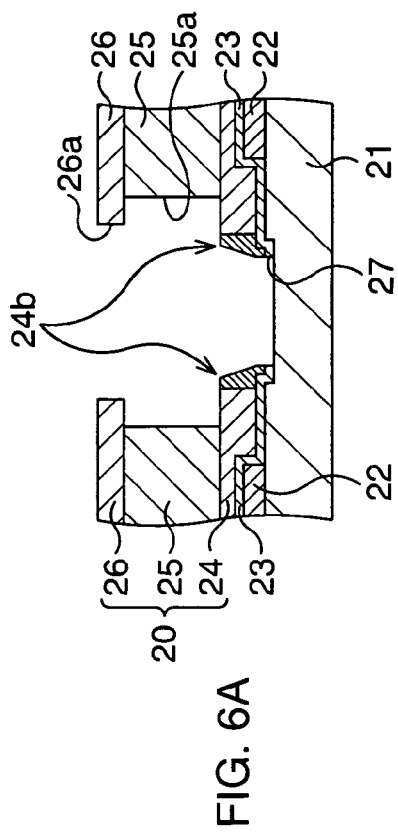

Then as shown in FIG. 6B, a shrink agent is applied to a coating thickness of about 200 nm by the spin coat method, and heat treated at 95° C. for 70 seconds and washed for one minute to shrink the particular fine gate aperture 24a in the lower resist layer 24 from about 0.2 μm to about 0.1 μm in length (first-round shrink process). The shrink agent is further applied to a coating thickness of about 200 nm by the spin coat method, and heat treated at 100° C. for 70 seconds and washed for one minute to shrink the fine gate aperture 24a from about 0.1 μm to about 0.05 μm in length (second-round shrink process).

Figure 6C:
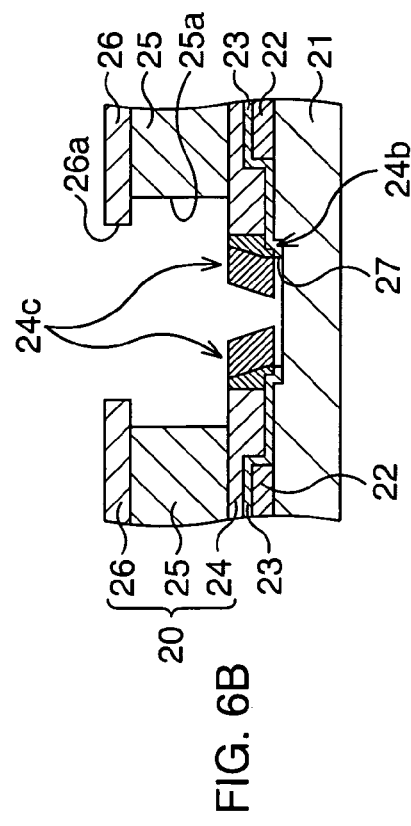

As shown in the figure, the shrunk region 24c of the lower resist film 24 produces a gap between the surface of the compound semiconductor substrate 21. If metal deposition is done in this status, the gate length may increase or vary because the electrode metal expands laterally due to the gap. Therefore as shown in FIG. 6C, the gap between the shrunk region 24c and the surface of the compound semiconductor substrate 21 is filled by heat treatment at a temperature equal to or higher than the softening point of the shrink agent, for example 125° C. in this embodiment, for five minutes. The multilayer resist structure according to this embodiment does not alter the aperture 25a of the intermediate resist film 25 or the over gate aperture 26a of the upper layer resist film 26.

Figure 6D:
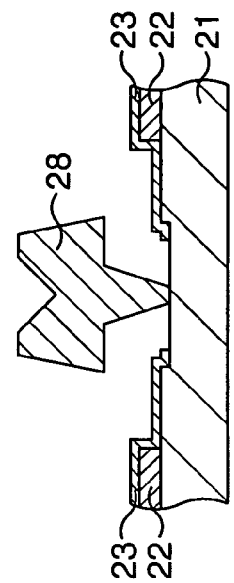

Then as shown in FIG. 6D, a metal film (not shown) consisting of, for example, Ti/Pt/Au is deposited by evaporation to thickness of about 10 nm/10 nm/300 nm to form a mushroom-shaped gate electrode 28 by the lift-off method. As shown in the figure, the surface component film 23 on the compound semiconductor substrate 21 is open near the junction of the gate electrode 28 and the compound semiconductor substrate 21, or along the sidewall 27 of the step portion.

Additional interlayer insulator film and upper-layer wiring are formed so as to cover the gate electrode 28, thus completing an integrated circuit.

As described above, according to the embodiment, a resist aperture can be formed with stable shrink effect and accurate control of the aperture length, and the mushroom-shaped gate electrode 28 having a minute lower shape can be achieved using this. Consequently, a mushroom-shaped gate with a length of 0.05 μm, which requires too high precision and evenness for mass production type electron beam lithography to attain, can be fabricated only at a particular site in the circuit (fast operating portion) at less cost.

Modified Embodiment

This is another aspect of embodiment 2. In this embodiment, the present invention is applied in forming what is generally called mushroom type gate electrodes using electron beam lithography to manufacture transistors.

FIGS. 7A to 7D and FIGS. 8A to 8D are schematic sectional views showing the method of manufacturing a transistor in order of steps according to modified embodiment 2.

Figure 7A:
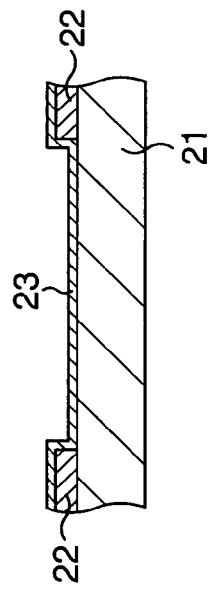
FIGS. 7A to 7D are schematic sectional views showing the method of manufacturing a transistor in order of steps according to a modification of embodiment 2.

As shown in FIG. 7A, a buffer layer, an InGaAs channel layer, an AlGaAs electron-supplying layer and a GaAs low-resistance layer are first grown sequentially on a semi-insulating GaAs substrate by the MOCVD method to form a compound semiconductor substrate 21, and an active region is formed by oxygen impregnation to form, for example, the source/drain 22, which is a pair of ohmic electrodes consisting of AuGe/Au with a coating thickness of about 20 nm/200 nm.

A surface component film 23 consisting of, for example, silicon nitride is formed on the compound semiconductor substrate 21 so as to cover the source/drain 22.

Figure 7C:
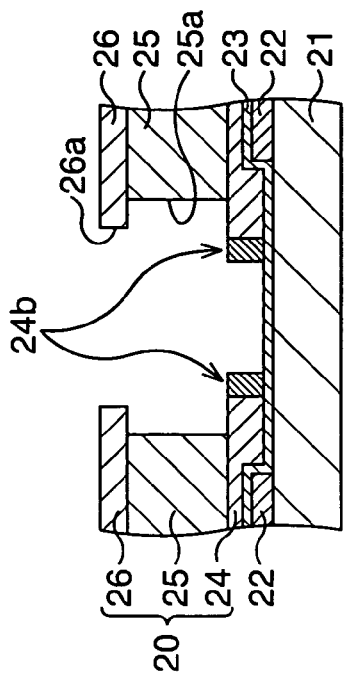
Figure 7B:
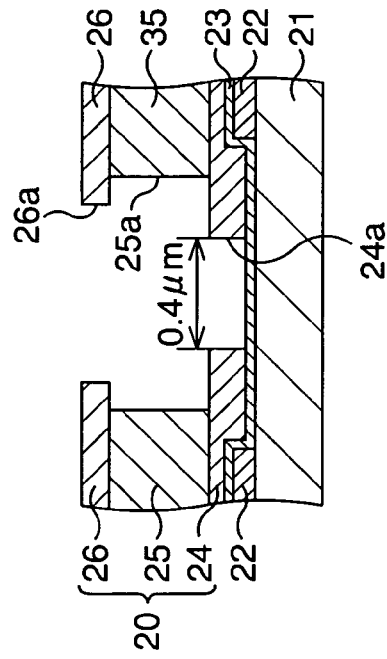

As shown in FIG. 7B, a multilayer resist film 20 is then formed by application.

Concretely, the positive type electron beam resist PMMA is first applied to a coating thickness of around 300 nm by the spin coat method and heat treated at 180° C. for five minutes to form a lower layer resist film 24. The alkali soluble resin PMGI is then applied to a coating thickness of around 500 nm by the spin coat method and heat treated at 180° C. for three minutes to form an intermediate layer resist film 25. A positive type electron beam resist (for example, ZEP520, Xeon Corp.) is then applied by the spin coat method and heat treated at 180° C. for three minutes to form an upper layer resist film 26. Consequently, a multilayer resist film 20 laminated with the lower resist film 24, the intermediate resist film 25 and the upper layer resist film 26 starting from the front face of the compound semiconductor 21 is formed.

Then an eaves-shaped resist aperture which permits lift-off is formed on the surface of the compound semiconductor substrate 21 to form a mushroom type of gate electrode.

Concretely, for example a pattern 0.0.7 μm in length and a pattern 0.1 μm in length are drawn in succession in the direction of electric current by electron beam lithography. The upper layer resist film 26 is then developed with a liquid mixture such as MIBK/IPA to form an over gate aperture 26a to be used for forming an over gate portion with a large electrode length in the upper layer resist film 26, and the intermediate resist film 25 is side etched with an alkali developer such as TMAH using the upper layer resist film 26 as a mask to form an aperture 25a in the intermediate resist film 25. Then, a fine gate aperture 24a, an aperture to form a fine gate portion conducting channel control of field-effect transistors, with a length of 0.4 μm in the direction of electric current is formed in the lower layer resist film 24 with a liquid mixture such as MIBK/IPA containing a lower concentration of MIBK than the developer used for the upper layer resist film 26.

Then as shown in FIG. 7C, to increase the shrink effect on the fine gate aperture 24a, the fine gate aperture 24a area in the lower layer resist film 24 is irradiated with electron beam and exposed to a dose lower than the development $E_{th}$ to form a modified region 24b. This will result in a greater shrink reaction selectively occurring in the fine gate aperture 24a undergoing irradiation with electron beam and only minor shrink reaction occurring in other portions forming a fine gate aperture 24a. Because aperture shrinking is normally targeted at only the fine gate aperture, a resin having low affinity with the shrink agent is used for the over gate portion (including the eaves portion) and a resin having high affinity with the shrink agent is used for the fine gate portion. This will allow the shrink reaction to be applied selectively to the fine gate aperture.

Figure 7D:
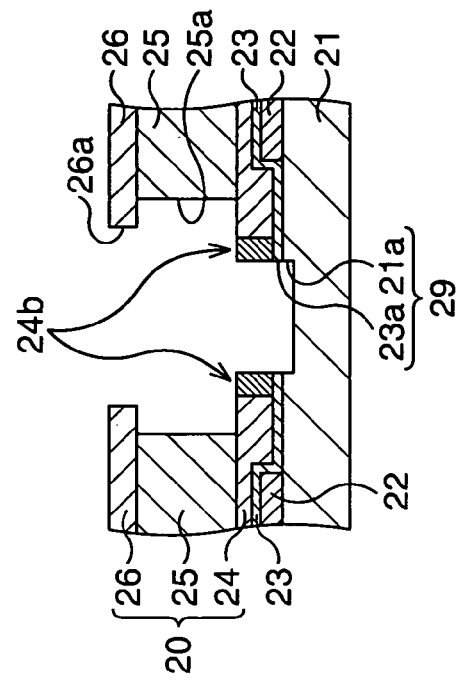

As shown in FIG. 7D, the surface component film 23 is then dry etched using the lower resist film 24 as a mask, and $SF_6$ as etching gas, and the surface of the GaAs low-resistance layer of the compound semiconductor substrate 21 is dry etched successively using $SiCl_4$ as etching gas. Consequently, an aperture 23a having the same shape as the fine gate aperture 24a is formed in the surface component film 23, a groove 21a having the same shape as the aperture 24a is formed in the GaAs low-resistance layer, and a relative step portion as compared to the bottom surface of the groove 21a is formed by the aperture 23a and the groove 21a, with the sidewall 29 of the step portion exposed through the aperture 24a.

Figure 8A:
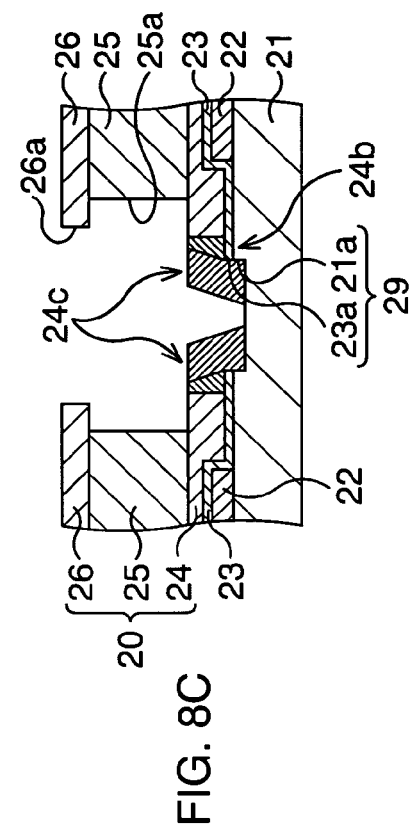
FIGS. 8A to 8D are schematic sectional views showing the method of manufacturing a transistor in order of steps according to a modification of embodiment 2.

Then as shown in FIG. 8A, the sidewall of the fine gate aperture 24a is processed by heat treatment at 130° C. for 10 minutes such that it will be tapered at an angle of about 70 degrees to a horizontal plane (for example, the substrate surface).

Figure 8B:
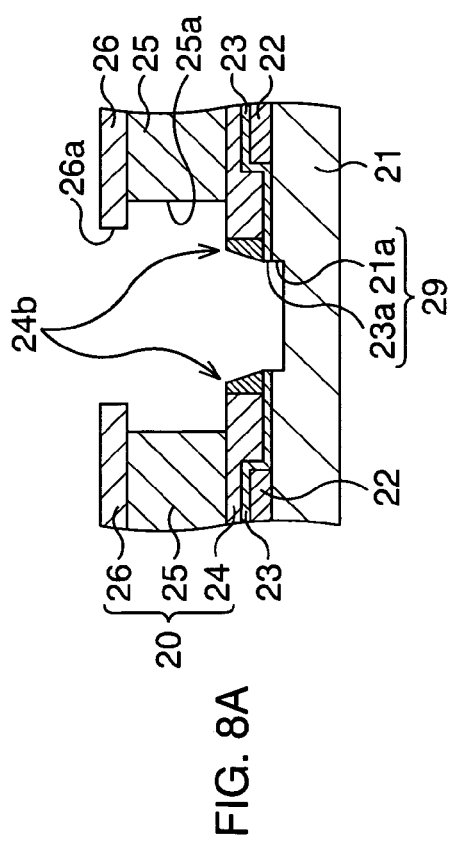

Then as shown in FIG. 8B, a shrink agent is applied to a coating thickness of about 200 nm by the spin coat method, and heat treated at 100° C. for 70 seconds to shrink the particular fine gate aperture 24a in the lower layer resist layer 24 from about 0.4 μm to about 0.2 μm in length (first-round shrink process). The shrink agent is further applied to a coating thickness of about 200 nm by the spin coat method, and heat treated at 110° C. for 70 seconds to shrink the fine gate aperture 24a from about 0.2 μm to about 0.1 μm in length (second-round shrink process). The shrink agent is further applied to a coating thickness of about 200 nm by the spin coat method, and heat treated at 110° C. for 70 seconds to shrink the fine gate aperture 24a from about 0.1 μm to about 0.05 μm in length (third-round shrink process). Thus a large shrinkage exceeding 0.2 μm can be achieved in a precise manner by performing the shrink process in divided rounds (three rounds in this embodiment).

Figure 8C:
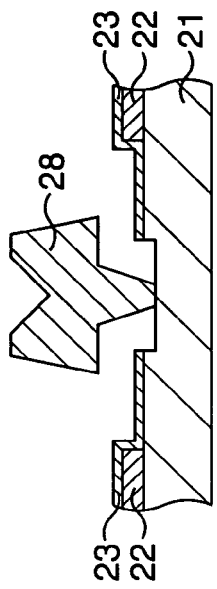

As shown in the figure, the shrunk region 24c of the lower resist film 24 produces a gap between the bottom surface of the groove 21a. If metal deposition is carried out in this status, the gate length may increase or vary because the electrode metal expands laterally due to the gap. Therefore as shown in FIG. 8C, the gap between the shrunk region 24c and the bottom surface of the groove 21a is filled by heat treatment at a temperature equal to or higher than the softening point of the shrink agent, for example 125° C. in this embodiment, for five minutes. The multilayer resist structure according to this embodiment does not alter the aperture 25a of the intermediate resist film 25 or the over gate aperture 26a of the upper layer resist film 26.

Figure 8D:
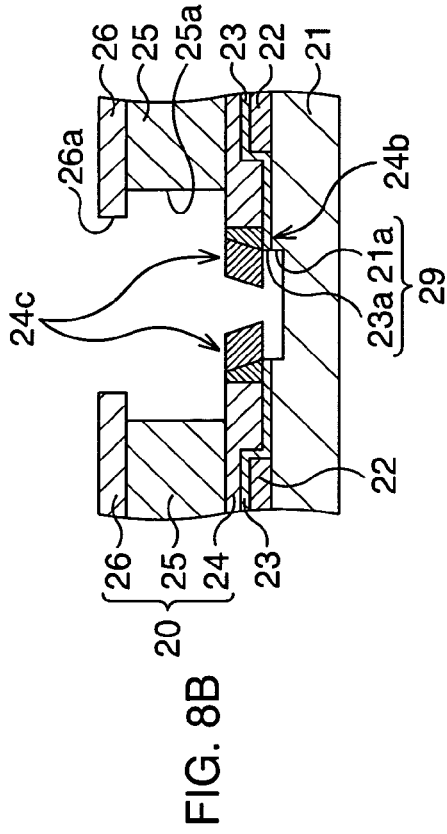

Then as shown in FIG. 8D, a metal film (not shown) consisting of, for example, Ti/Pt/Au is deposited by evaporation to thickness of about 10 nm/10 nm/300 nm to form a mushroom-shaped gate electrode 28 by the lift-off method. As shown in the figure, the surface component film 23 on the compound semiconductor substrate 21 is open near the junction of the gate electrode 28 and the compound semiconductor substrate 21, or along the sidewall 29 of the step portion.

Additional interlayer insulator film and upper-layer wiring are formed so as to cover the gate electrode 28, thus completing an integrated circuit.

Although in this embodiment, a relative step portion to ensure shrinking of the resist aperture is formed by the surface component film 23 and the groove 21 in the substrate, a step portion can be formed only by the groove in the substrate without forming a surface component film.

As described above, according to the modified embodiment, a resist aperture can be formed with stable shrink effect and accurate control of the aperture length, and the mushroom-shaped gate electrode 28 having a minute lower shape can be achieved using this. Consequently, a mushroom-shaped gate with a length of 0.05 μm, which requires too high precision and evenness for the mass production type of electron beam lithography to attain, can be fabricated only at a particular site in the circuit (fast operating portion) at less cost.

Embodiment 3

In this embodiment, the present invention is applied in forming what is generally called mushroom type gate electrodes using i ray exposure to manufacture transistors.

FIGS. 9A to 9E and FIGS. 10A to 10E are schematic sectional views showing the method of manufacturing a transistor in order of steps according to embodiment 3.

As shown in FIG. 9A, a buffer layer, an InGaAs channel layer, an AlGaAs electron-supplying layer and a GaAs low-resistance layer are first grown sequentially on a semi-insulating GaAs substrate by the MOCVD method to form a compound semiconductor substrate 31, and an active region is formed by oxygen impregnation to form, for example, the source/drain 32, which is a pair of ohmic electrodes consisting of AuGe/Au with a coating thickness of about 20 nm/200 nm.

A surface component film 33 consisting of, for example, silicon nitride is formed on the compound semiconductor substrate 31 so as to cover the source/drain 32.

As shown in FIG. 9B, a multilayer resist film 30 is then formed by application.

Concretely, the positive type electron beam resist PMMA is first applied to a coating thickness of around 300 nm by the spin coat method and heat treated at 180° C. for five minutes to form a lower layer resist film 34. The alkali soluble resin PMGI is then applied to a coating thickness of around 500 nm by the spin coat method and heat treated at 180° C. for three minutes to form an intermediate layer resist film 35. A positive type electron beam resist (for example, ZEP520, Xeon Corp.) is then applied by the spin coat method and heat treated at 180° C. for three minutes to form an upper layer resist film 36. Consequently, a multilayer resist film 30 laminated with the lower resist film 34, intermediate resist film 35 and the upper layer resist film 36 starting from the front face of the compound semiconductor 31 is formed.

Then an i ray resist film 41 is formed by application on the upper layer resist film 36, and an aperture 41a about 0.4 μm in length is formed by UV exposure at a site in the i ray resist film 41 corresponding to where a gate electrode is formed. A shrink agent is then applied to a coating thickness of about 200 nm by the spin coat method, and heat treated at 100° C. for 70 seconds and washed for one minute to shrink the aperture 41a of the i ray resist film 41 from about 0.4 μm to about 0.25 μm in length. Because the aperture length is large, clogging of the aperture is unlikely. Scum may occur but will not become a problem because the aperture 41a is used for transfer.

Then as shown in FIG. 9C, a multilayer resist film 30 is patterned by dry etching using an etching gas mainly consisting of oxygen, and using the i ray resist film 41 having the aperture 41a as a mask, and part of the surface of the surface component film 33 is exposed. Consequently, an over gate aperture 36a is formed in the upper layer resist film 36, an aperture 35a is formed in the intermediate resist film 35, and a fine gate aperture 34a about 0.4 μm in length is formed in the lower layer resist film 34. The i ray resist film 41 is removed using acetone.

Then as shown in FIG. 9D, the intermediate resist film 35 is side etched with an alkali developer such as TMAH using the upper layer resist film 36 as a mask to expand the aperture 35a.

Then as shown in FIG. 9E, to increase the shrink effect on the fine gate aperture 34a, the fine gate aperture 34a area in the lower layer resist film 34 may be irradiated with electron beam and exposed to a dose lower than the development $E_{th}$ to form a modified region 34b. This will result in a greater shrink reaction in the fine gate aperture 34a introducing the modified region 34b. The following description and figures are provided to illustrate examples involving a modified region 34b, and are not intended to limit embodiments of the invention.

Because aperture shrinking is normally targeted at only the fine gate aperture, a resin having low affinity with the shrink agent is used for the over gate portion (including the eaves portion) and a resin having high affinity with the shrink agent is used for the fine gate portion.

Figure 10A:
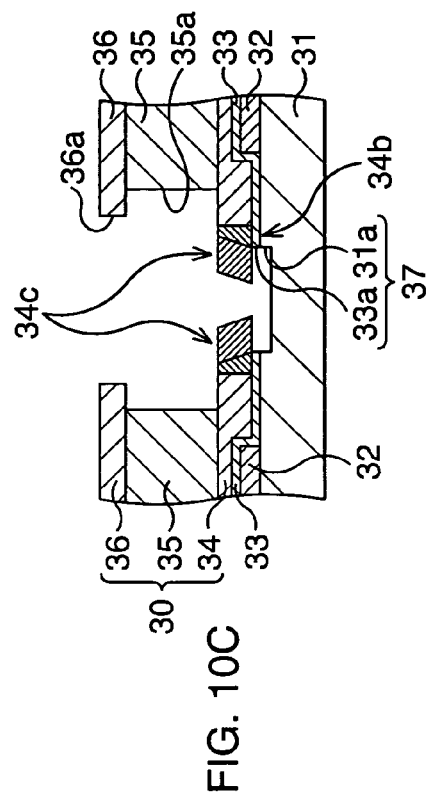
FIGS. 10A to 10E are schematic sectional views showing the method of manufacturing a transistor in order of steps according to embodiment 3.

As shown in FIG. 10A, the surface component film 33 is then dry etched using the lower resist film 34 as a mask, and $SF_6$ as etching gas, and the surface of the GaAs low-resistance layer of the compound semiconductor substrate 31 is dry etched successively using $SiCl_4$ as etching gas. Consequently, an aperture 33a having the same shape as the fine gate aperture 34a is formed in the surface component film 33, a groove 31a having the same shape as the aperture 34a is formed in the GaAs low-resistance layer, and a relative step portion 37 as compared to the bottom surface of the groove 31a is formed by the aperture 33a and the groove 31a, with the side wall 37a of the step portion 37 exposed through the aperture 34a.

Figure 10B:
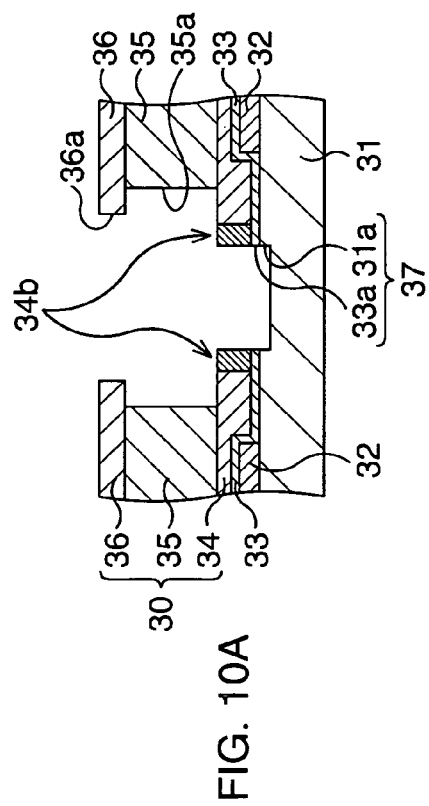

Then as shown in FIG. 10B, the sidewall of the fine gate aperture 34a is processed by heat treatment at 130° C. for 10 minutes such that it will be tapered at an angle of about 70 degrees to a horizontal plane (for example, the substrate surface).

Figure 10C:
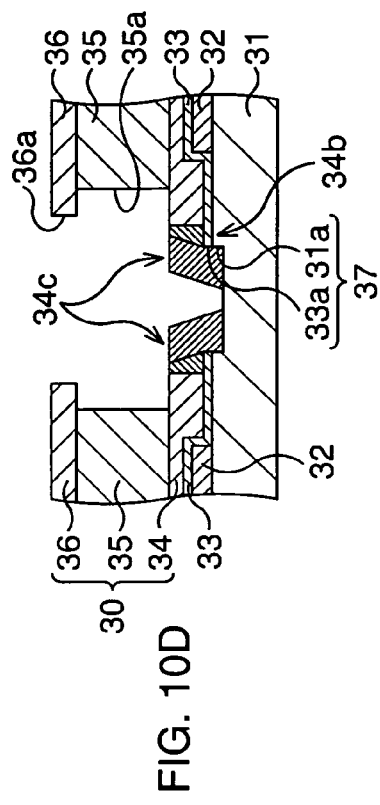

Then as shown in FIG. 10C, a shrink agent is applied to a coating thickness of about 200 nm by the spin coat method, and heat treated at 100° C. for 70 seconds and washed for one minute to shrink the particular fine gate aperture 34a in the lower layer resist layer 34 from about 0.4 μm to about 0.2 μm in length (first-round shrink process). The shrink agent is further applied to a coating thickness of about 200 nm by the spin coat method, and heat treated at 110° C. for 70 seconds and washed for one minute to shrink the fine gate aperture 34a from about 0.2 μm to about 0.1 μm in length (second-round shrink process). The shrink agent is further applied to a coating thickness of about 200 nm by the spin coat method, and heat treated at 110° C. for 70 seconds and washed for one minute to shrink the fine gate aperture 34a from about 0.1 μm to about 0.05 μm in length (third-round shrink process). Thus a large shrinkage exceeding 0.2 μm can be achieved in a precise manner by performing the shrink process in divided rounds (three rounds in this embodiment).

Figure 10D:
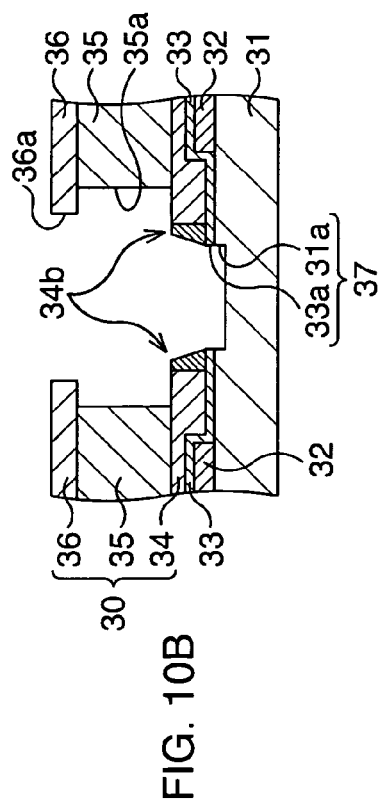

As shown in the figure, the shrunk region 34c of the lower resist film 34 produces a gap between the bottom surface of the groove 31a. If metal deposition is carried out in this status, the gate length may increase or vary because the electrode metal expands laterally due to the gap. Therefore as shown in FIG. 10D, the gap between the shrunk region 34c and the bottom surface of the groove 31a is filled by heat treatment at a temperature equal to or higher than the softening point of the shrink agent, for example 125° C. in this embodiment, for five minutes. The multilayer resist structure according to this embodiment does not alter the aperture 35a of the intermediate resist film 35 or the over gate aperture 36a of the upper layer resist film 36.

Figure 10E:
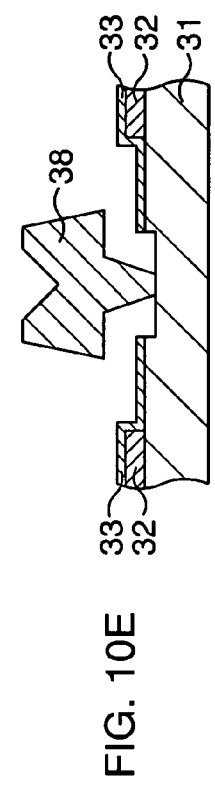

Then as shown in FIG. 10E, a metal film (not shown) consisting of, for example, Ti/Pt/Au is deposited by evaporation to thickness of about 10 nm/10 nm/300 nm to form a mushroom-shaped gate electrode 38 by the lift-off method. As shown in the figure, the surface component film 33 on the compound semiconductor substrate 31 is open near the junction of the gate electrode 38 and the compound semiconductor substrate 31, or along the sidewall 37a of the step portion 37.

Additional interlayer insulator film and wiring are formed so as to cover the gate electrode 38, thus completing an integrated circuit.

As described above, according to the embodiment, a resist aperture can be formed with stable shrink effect and accurate control of the aperture length, and the mushroom-shaped gate electrode 38 having a minute lower shape can be achieved using this. Consequently, a mushroom-shaped gate with a length of 0.05 μm, which requires too high precision and evenness for the mass production type of electron beam lithography to attain, can be fabricated at less cost using the i ray exposure technology only, as required, at a particular site in the circuit (fast operating portion).

INDUSTRIAL APPLICABILITY

The present invention provides, with respect to a resist using short-wavelength light (short-wavelength resist) or a resist using electron beam (electron beam resist), a method of forming a minute aperture with stable shrink effect and accurate control of the length thereof.

What is claimed is:

1. A method of manufacturing a semiconductor device comprising:
    forming an interlayer insulator film above a substrate;
    forming a resist on said interlayer insulator film;
    forming an aperture in said resist;
    processing said interlayer insulator film using said resist as a mask to form a groove in said interlayer insulator film based on the surface of said interlayer insulator film;

processing said resist a plurality of times to shrink said aperture;

applying heat at a temperature equal to or higher than the softening point of the organic matter forming the shrunk region of said aperture after said multiple-round shrink process of said aperture;

processing said interlayer insulator film using said resist after shrinkage as a mask to form a connecting hole in said interlayer insulator film according to the shape of said aperture after shrinkage;

removing said resist; and depositing conductive material on said interlayer insulator film so as to fill at least said connecting hole.

2. The method of manufacturing a semiconductor device according to claim 1, wherein said interlayer insulator film is a multilayer insulator comprising at least two layers of different materials.

3. The method of manufacturing a semiconductor device according to claim 1, further comprising the step of exposing part or all of the sidewall of said aperture in said resist to electron beam or light prior to shrinking said aperture to form a modified region.

4. The method of manufacturing a semiconductor device according to claim 1, further comprising the step of tapering the sidewall of said aperture in said resist prior to shrinking said aperture.

5. The method of manufacturing a semiconductor device according to claim 1, wherein said resist is formed after said groove is formed, and said aperture is formed such that the sidewall of said groove is exposed through said aperture.

6. The method of manufacturing a semiconductor device according to claim 1, wherein in said multiple-round shrink process of said aperture at least one round of said shrink process of said aperture is performed at a treatment temperature different from that used for the other rounds.

7. The method of manufacturing a semiconductor device according to claim 1, wherein in said multiple-round shrink process of said aperture a shrink agent to shrink an aperture is used in at least one round of said shrink process of said aperture at a concentration different from that used for the other rounds.

8. A method of manufacturing a semiconductor device according to claim 1, where said multiple-rounds of shrink process are performed under different processing conditions respectively.

9. The method of manufacturing a semiconductor device according to claim 1, wherein, by said heat treatment, only a lower part of the shrunk region is brought in contact with a bottom of said groove.

10. A method of manufacturing a semiconductor device comprising:

forming a resist above a substrate;

forming an aperture in said resist;

processing an exposed portion from said aperture using said resist as a mask to form a relative step portion according to the shape of said aperture based on the surface of said substrate;

processing said resist a plurality of times to shrink said aperture;

applying heat at a temperature equal to or higher than the softening point of the organic matter forming the shrunk region of said aperture after said multiple-round shrink process of said aperture;

depositing conductive material so as to fill said aperture; and removing said resist to form a gate electrode comprising said conductive material.

11. The method of manufacturing a semiconductor device according to claim 10, wherein said resist comprises at least two layers including a lower resist layer and an upper resist layer, a first aperture is formed in said lower resist layer as said aperture, and a second aperture designed to be an eaves structure for forming said gate electrode by the lift-of method is formed in said upper resist layer.

12. The method of manufacturing a semiconductor device according to claim 10, wherein said resist comprises at least two layers including a lower resist layer and an upper resist layer, another resist having a third aperture is formed on said resist, said resist is processed using said another resist as a mask, a first aperture is formed in said lower resist layer as said aperture, and a second aperture designed to be an eaves structure for forming said gate electrode by the lift-of method is formed in said upper resist layer.

13. The method of manufacturing a semiconductor device according to claim 10, further comprising the step of forming a surface component film above said substrate, wherein said step portion is formed in said surface component film according to the shape of said aperture by processing said surface component film using said resist as a mask.

14. The method of manufacturing a semiconductor device according to claim 10, wherein said step portion is formed on said substrate according to the shape of said aperture by processing said substrate using said resist as a mask.

15. The method of manufacturing a semiconductor device according to claim 10, further comprising the step of exposing part or all of the sidewall of said aperture in said resist to electron beam or light prior to shrinking said aperture to form a modified region.

16. The method of manufacturing a semiconductor device according to claim 10, further comprising the step of tapering the sidewall of said aperture in said resist prior to shrinking said aperture.

17. The method of manufacturing a semiconductor device according to claim 10, wherein said aperture is formed such that the sidewall of said step portion will be exposed through said aperture.

18. The method of manufacturing a semiconductor device according to claim 10, wherein in said multiple-round shrink process of said aperture at least one round of said shrink process of said aperture is performed at a treatment temperature different from that used for the other rounds.

19. The method of manufacturing a semiconductor device according to claim 10, wherein in said multiple-round shrink process of said aperture a shrink agent to shrink an aperture is used in at least one round of said shrink process at a concentration different from that used for the other rounds.

20. The method of manufacturing a semiconductor device according to claim 10, wherein, by said heat treatment, only a lower part of the shrunk region is brought in contact with a bottom of said step portion.

* * * * *